(12) United States Patent
Ina et al.

(10) Patent No.: US 6,428,721 B1
(45) Date of Patent: Aug. 6, 2002

(54) POLISHING COMPOSITION AND POLISHING METHOD EMPLOYING IT

(75) Inventors: Katsuyoshi Ina; Tadahiro Kitamura; Satoshi Suzumura, all of Aichi (JP)

(73) Assignee: Fujimi Incorporated, Nishikasugai-gun (JP)

( * ) Notice: Subject to any disclaimer, the term of this patent is extended or adjusted under 35 U.S.C. 154(b) by 0 days.

(21) Appl. No.: 09/564,546

(22) Filed: May 4, 2000

(51) Int. Cl.[7] ............................................... C09K 13/06
(52) U.S. Cl. ...................... 252/79.4; 438/690; 438/691; 438/692; 438/693
(58) Field of Search .......................... 252/79.4; 438/690, 438/692, 691, 693

(56) References Cited

U.S. PATENT DOCUMENTS 5,837,446 A * 11/1998 Cozzette et al. ............... 435/6
6,171,352 B1 * 1/2001 Lee et al. ...................... 51/307
6,207,360 B1 * 3/2001 Ishikawa et al. ............ 430/434
6,278,008 B1 * 8/2001 Endo et al. .................. 554/227

FOREIGN PATENT DOCUMENTS

| EP | 0 831 136 | 3/1998 |
| EP | 0 984 049 | 3/2000 |
| WO | WO 99/64527 | 12/1999 |
| WO | WO 00/00567 | 1/2000 |

* cited by examiner

*Primary Examiner*—Benjamin L. Utech
*Assistant Examiner*—Vanessa Perez-Ramos
(74) *Attorney, Agent, or Firm*—Oblon, Spivak, McClelland, Maier & Neustadt, P.C.

(57) ABSTRACT

A polishing composition comprising the following components:

(a) an abrasive,
(b) α-alanine,
(c) hydrogen peroxide, and
(d) water.

13 Claims, No Drawings

POLISHING COMPOSITION AND POLISHING METHOD EMPLOYING IT

BACKGROUND OF THE INVENTION

1. Field of the Invention

The present invention relates to a polishing composition to be used for polishing substrates for semiconductors, photomasks and various memory hard disks, particularly to a polishing composition useful for polishing for planarization of the surface of device wafers in e.g. semiconductor industry, and a polishing method employing such a composition.

More particularly, the present invention relates to a polishing composition which is highly efficient and provides high selectivity in the polishing of semiconductor devices to which so-called chemical and mechanical polishing (CMP) technology is applied, in the processing of device wafers, and a polishing method employing such a composition.

2. Discussion of Background

Progress of so-called high technology products including computers has been remarkable in recent years, and parts to be used for such products, such as ULSI, have been developed for high integration and high speed, year after year. Along with such progress, the design rule for semiconductor devices has been progressively refined year after year, the depth of focus in a process for producing devices tends to be shallow, and planarization required for the pattern-forming surface tends to be increasingly severe.

Further, to cope with an increase in resistance of the wiring due to refinement of the wiring, it has been studied to employ copper instead of tungsten or aluminum, as the wiring material.

By its nature, copper is hardly processable by etching, and accordingly, it requires the following process. Namely, after forming wiring grooves and vias on an insulating layer, copper wirings are formed by sputtering or plating, and then an unnecessary copper layer deposited on the insulating layer is removed by chemical mechanical polishing (hereinafter referred to as CMP) which is a combination of mechanical polishing and chemical polishing.

However, in such a process, it may happen that copper atoms will diffuse into the insulating layer to deteriorate the device properties. Therefore, for the purpose of preventing diffusion of copper atoms, it has been studied to provide a barrier layer on the insulating layer having wiring grooves or vias formed. As a material for such a barrier layer, metal tantalum or a tantalum compound (hereinafter will generally be referred to as a tantalum-containing compound) is most suitable also from the viewpoint of the reliability of the device and is expected to be employed mostly in the future.

Accordingly, in such a CMP process for a semiconductor device containing such a copper layer and a tantalum compound, firstly the copper layer as the outermost layer and then the tantalum-containing compound layer as the barrier layer, are polished, respectively, and polishing will be completed when it has reached the insulating layer of e.g. silicon dioxide or monofluoro silicon oxide (SiOF). As an ideal process, it is desired that by using only one type of a polishing composition, the copper layer and the tantalum-containing compound layer are uniformly removed by polishing in a single polishing step, and polishing will be completed certainly when it has reached the insulating layer. However, copper and a tantalum-containing compound are different in their hardness, chemical stability and other mechanical properties and accordingly in the processability, and thus, it is difficult to adopt such an ideal polishing process. Accordingly, the following two step polishing process, i.e. polishing process divided into two steps, is being studied.

Firstly, in the first step polishing (hereinafter referred to as the first polishing), using a polishing composition capable of polishing a copper layer at a high efficiency, the copper layer is polished using e.g. a tantalum-containing compound layer as a stopper until such a tantalum-containing compound layer is reached. Here, for the purpose of not forming various surface damages such as recesses, erosion, dishing, etc., on the copper layer surface, polishing may be terminated immediately before reaching the tantalum-containing compound layer i.e. while a copper layer still slightly remains. Then, in the second step polishing (hereinafter referred to as the second polishing), using a polishing composition capable of polishing mainly a tantalum containing layer at a high efficiency, the remaining thin copper layer and the tantalum-containing compound layer are continuously polished using the insulating layer as a stopper, and polishing is completed when it has reached the insulating layer.

The polishing composition to be used in the first polishing is required to have a property such that it is capable of polishing the copper layer at a high stock removal rate without forming the above-mentioned various surface defects on the copper layer surface, which can not be removed by the second polishing. with respect to such a polishing composition for a copper layer, for example, JP-A-7-233485 discloses a polishing liquid for a copper type metal layer, which comprises at least one organic acid selected from the group consisting of aminoacetic acid and amidesulfuric acid, an oxidizing agent and water, and a method for producing a semiconductor device using such a polishing liquid. If this polishing liquid is used for polishing a copper layer, a relatively high stock removal rate is obtainable. It is believed that copper atoms on the copper layer surface be oxidized by the action of the oxidizing agent, and the oxidized copper elements are taken into a chelate compound, whereby a high stock removal rate can be obtained.

However, as a result of the experiments conducted by the present inventors, it has been found that when the above polishing liquid is used for polishing a semiconductor device having a copper layer and a tantalum-containing compound layer, the ratio (hereinafter referred to as "the selectivity ratio") of the stock removal rate of the copper layer to the stock removal rate of the tantalum-containing compound layer, is inadequate, and if the composition, etc. are adjusted to increase the selectivity ratio, smoothness of the copper layer surface after polishing tends to be remarkably impaired. Namely, the above-mentioned polishing liquid has had problems with respect to the selectivity ratio and smoothness of the polished surface and is still required to be further improved.

SUMMARY OF THE INVENTION

The present invention has been made to solve the above-described problems. Namely, it is an object of the present invention to provide a polishing composition and a polishing method, whereby in a CMP process in the production of a semiconductor device having at least a copper layer and a tantalum-containing compound layer, it is possible to provide a high selectivity ratio i.e. a high stock removal rate of the copper layer and a low stock removal rate of the tantalum-containing compound layer, and provides a polished surface excellent in smoothness.

The present invention provides a polishing composition comprising the following components:

(a) an abrasive,
(b) α-alanine,
(c) hydrogen peroxide, and
(d) water.

Further, the present invention provides a polishing method for polishing a semiconductor device having a layer of copper and a layer of a tantalum-containing compound formed on a substrate, by means of a polishing composition comprising the following components:

(a) an abrasive,
(b) α-alanine,
(c) hydrogen peroxide, and
(d) water.

According to the present invention, in a CMP process for a semiconductor device having at least a copper layer and a tantalum-containing compound layer, it is possible to provide a high selectivity ratio i.e. a high stock removal rate of the copper layer and a low stock removal rate of the tantalum-containing compound layer, and to provide a polished surface excellent in smoothness. Further, according to the present invention, it is possible to produce a semiconductor device in good yield in the above-mentioned production of the semiconductor device.

DETAILED DESCRIPTION OF THE PREFERRED EMBODIMENTS

Abrasive

In the polishing composition of the present invention, the abrasive has a role as so-called abrasive grains and serves to perform mechanical polishing in the CMP processing. Namely, the abrasive is one having an action to mechanically remove a brittle layer formed on the surface to be polished, by various compound components which will be described hereinafter.

The polishing composition of the present invention contains, as an abrasive, at least one member selected from the group consisting of silicon dioxide, aluminum oxide, cerium oxide, titanium oxide, silicon nitride, zirconium oxide, silicon carbide and manganese dioxide.

Among them, silicon dioxide includes colloidal silica, fumed silica and various other types different in the nature or the method for preparation.

Aluminum oxide also includes α-alumina, δ-alumina, θ-alumina, κ-alumina and other morphologically different ones. Further, there is one so-called fumed alumina from the method for its preparation.

Cerium oxide includes trivalent and tetravalent ones from its oxidation number, and it includes hexagonal system, tesseral system and face centered cubic system ones from its crystal system.

Zirconium oxide includes monoclinic system, tetragonal system and amorphous ones from its crystal system. Further, there is one so-called fumed zirconia from the method for its preparation. Further, there are so-called partially stabilized zirconia having calcium, magnesium or yttrium solid-solubilized to stabilize part of crystals as a cubic system, and completely stabilized zirconia having the solid-solubilized amount of such an element increased to completely stabilize all crystals as a cubic system.

Titanium oxide includes titanium monoxide, dititanium trioxide, titanium dioxide and other types from its crystal system. Further, there is one so-called fumed titania from the method for its preparation.

Silicon nitride includes α-silicon nitride, β-silicon nitride, amorphous silicon nitride and other morphologically different ones.

Silicon carbide also includes α-type and β-type.

Manganese dioxide includes α-manganese dioxide, β-manganese dioxide, γ-manganese dioxide, δ-manganese dioxide, ε-manganese dioxide, η-manganese dioxide and other morphologically different ones from its morphology.

For the polishing composition of the present invention, these abrasives may be employed optionally in combination as the case requires. When they are used in combination, the manner of the combination or their proportions, are not particularly limited.

Among these abrasives, it is preferred to employ an abrasive in a colloidal state with a uniform small particle size in order to reduce precipitation of the abrasive in the polishing composition during the storage and to prevent formation of scratches on the object to be polished, due to the abrasive. Namely, when silicon dioxide is employed, it is preferably fumed silica and/or colloidal silica, and when alumina is employed, it is preferably fumed alumina and/or colloidal alumina.

The above-described adhesives are intended to polish the surface to be polished by the mechanical action. Among them, the particle size of silicon dioxide or aluminum oxide is usually from 0.01 to 0.2 μm, preferably from 0.015 to 0.1 μm as an average particle size observed by a scanning electron microscope. Likewise, the particle size of cerium oxide, zirconium oxide, titanium oxide, silicon nitride, silicon carbide or manganese dioxide, is usually from 0.03 to 0.3 μm, preferably from 0.05 to 0.2 μm, as an average particle size observed by a scanning electron microscope.

If the primary particle sizes of these abrasives are too large, the mechanical polishing action will be too high, whereby the rate of polishing the tantalum-containing compound layer will increase, and scratches tend to form during the polishing. On the other hand, if the primary particle sizes are too small, the mechanical polishing action will decrease, whereby the stock removal rate of the copper layer tends to be low.

The content of the abrasive in the polishing composition of the present invention is usually from 10 to 200 g/l, preferably from 30 to 100 g/l. If the content of the abrasive is too small, the mechanical polishing power decreases, whereby the stock removal rate of the copper layer is likely to decrease. On the other hand, if the content of the abrasive is too large, the mechanical polishing power increases, and the rate of polishing the tantalum-containing compound layer tends to be too high and difficult to control.

α-alanine

The polishing composition of the present invention contains α-alanine. α-alanine has optical isomers, and for the polishing composition of the present invention, any one of D-form, L-form or DL-form may be employed.

The content of α-alanine in the polishing composition of the present invention is usually from 0.02 to 0.20 mol/l, preferably from 0.05 to 0.15 mol/l. If the content of α-alanine is too small, the stock removal rate of the copper layer tends to be small. On the other hand, if it is too large, the stock removal rate of the copper layer tends to be too high and difficult to control, whereby smoothness of the copper layer surface after polishing tends to be poor.

Further, alanine includes β-alanine as an isomer. β-alanine is structurally different from α-alanine and believed not to provide the same function as α-alanine in the polishing composition of the present invention. However, in the polishing compositions of the present invention, β-alanine will not impair the effects of the present invention and may be contained in the polishing composition of the present invention. Usually, a mixture of α-alanine and β-alanine is inexpensive as compared with pure α-alanine, and from the viewpoint of the cost, it is advisable to use such a mixture for industrial applications. However, even in such a case, the content of α-alanine is preferably within the above-mentioned range. Accordingly, when a mixture of α-alanine and β-alanine is to be employed, the content of the alanine mixture should be determined taking into consideration of the blend ratio.

Hydrogen Peroxide

The polishing composition of the present invention contains hydrogen peroxide. In the polishing composition of the present invention, hydrogen peroxide is believed to act as an oxidizing agent. Here, hydrogen peroxide has a characteristic such that one having a sufficient oxidizing power to oxidize the copper layer and containing no metal ion as an impurity, can readily be available, and thus it is particularly suitable for the polishing composition of the present inventions.

The content of hydrogen peroxide in the polishing composition of the present invention is usually from 0.01 to 1 mol/l, preferably from 0.05 to 0.3 mol/l, more preferably from 0.08 to 0.15 mol/l. If the content of hydrogen peroxide is too small or too large, the stock removal rate of the copper layer tends to be small, and due care will accordingly be required.

Water

The medium of the polishing composition of the present invention is water. Water is preferably one having impurities reduced as far as possible, so that the above-mentioned respective components can precisely perform their roles. Namely, water is preferably distilled water, or one having impurity ions removed by an ion exchange resin and having suspended matters removed by a filter.

Polishing Composition

The polishing composition of the present invention is prepared usually by mixing, dissolving or dispersing the above-described respective components, i.e. the abrasive, α-alanine and the oxidizing agent, in water. Here, methods for mixing, dissolving or dispersing are optional. For example, stirring by a vane-type stirrer or supersonic dispersion may be employed. By such a method, soluble components will be dissolved and insoluble components will be dispersed, whereby the composition will be a uniform dispersion.

The polishing composition of the present invention may further contain an anticorrosive, a pH-adjusting agent to adjust the pH, various surfactants and other additives, as the case requires.

The anticorrosive is to suppress the etching action against the copper layer. By this effect, it is possible to suppress reduction of the copper layer due to formation of surface defects such as recesses, dishing or erosion in the polishing.

As the anticorrosive which can be used for the polishing composition of the present invention, any optional anticorrosive may be employed so long as it is capable of suppressing the etching action against the copper layer. Usually, benzotriazole, tolyltriazole, benzimidazole, triazole, imidazole and other may be mentioned. Among them, benzotriazole or tolyltriazole is preferred. The amount of such an anticorrosive to be incorporated varies depending upon the type of the anticorrosive employed, but it is usually from 0.005 to 0.0012 mol/l. When an anticorrosive is added to the polishing composition of the present invention, the stock removal rate may sometimes decrease. Accordingly, it is necessary to take due care for selection of the type and the content.

In the present invention, the pH-adjusting agent is used to improve the stability of the polishing composition, to improve the stability in use or to meet the requirements of various regulations. As a pH-adjusting agent employed to lower the pH of the polishing composition of the present invention, hydrochloric acid, nitric acid, sulfuric acid, chloroacetic acid, tartaric acid, succinic acid, citric acid, malic acid, malonic acid, various fatty acids, various polycarboxylic acids, etc., may be mentioned. On the other hand, one to be used for the purpose of increasing the pH, potassium hydroxide, sodium hydroxide, ammonia, ethylenediamine, piperazine, polyethyleneimine, etc., may be mentioned. The polishing composition of the present invention is not particularly limited with respect to the pH, but it is usually adjusted to pH 3 to 10.

In the polishing composition of the present invention, the surfactant is used to increase the dispensability of the abrasive or to adjust the viscosity or the surface tension of the polishing composition. The surfactants include, for example, a dispersing agent, a wetting agent, a thickener, a defoaming agent, a foaming agent, a water repellent, etc. The surfactant to be used as a dispersing agent, may usually be of a sulfonic acid type, a phosphoric acid type, a carboxylic acid type or a nonionic acid type.

For the preparation of the polishing composition of the present invention, there is no particular restriction as to the order of mixing the various additives or the mixing method.

The polishing composition of the present invention may be prepared, stored or transported in the form of a stock solution having a relatively high concentration, so that it may be diluted for use at the time of actual polishing operation. The above-mentioned preferred range for the concentration is one for the actual polishing operation. Needless to say, in the case of adopting such a method of use, the stock solution during the storage or transportation is a solution having a higher concentration.

Further, hydrogen peroxide has a characteristic such that it decomposes in the presence of metal ions, ammonium ions or an amine. Accordingly, in the polishing composition of the present invention, it is advisable to add and mix it to the polishing composition immediately prior to the actual use for polishing operation. Such decomposition of hydrogen peroxide can be suppressed by incorporating a carboxylic acid or alcoholic molecules. Namely, it is possible to obtain such an effect by the above-mentioned pH-adjusting agent. However, such decomposition will be influenced also by the storage environment, and there is a possibility that part of hydrogen peroxide undergoes decomposition due to a temperature change during transportation or due to formation of a stress. Accordingly, it is preferred to carry out the mixing of hydrogen peroxide immediately before polishing.

Polishing Mechanism

The polishing composition of the present invention provides a high stock removal rate of the copper layer, while it provides a low stock removal rate of the tantalum-containing compound layer, whereby it provides a high selectivity ratio, and a polished surface excellent in smoothness can be obtained. This polishing mechanism is not clearly understood, but may be explained as follows.

Firstly, α-alanine is believed to form a chelate bond to copper during the polishing and thus provides a high stock removal rate of the copper layer. Whereas glycine which used to be employed in the prior art also shows a chelating action to the copper layer, but such an action is too strong, whereby the stock removal rate of the tantalum-containing compound layer tends to be too high, and no adequate selectivity ratio can be obtained. Further, smoothness of the copper film surface after the polishing tends to be impaired. Namely, α-alanine contains a carboxyl group and an amino group at α-positions, which provides chelating effects, but a methyl group likewise present at the α-position has a function to adjust the effects of, the carboxyl group and the amino group, whereby the stock removal rate of the tantalum-containing compound film is suppressed, and smoothness of the copper film surface after polishing will not be lost. From such a mechanism, it should be understood that β-alanine would not provide the effects of the present invention.

Further, in the polishing composition of the present invention, hydrogen peroxide is believed to provide an oxidizing action. Such an action is utilized in a common CMP processing. However, in the present invention, polishing is more effectively accelerated by a combination of the above-mentioned chelating effect by α-alanine and the oxidizing action of hydrogen peroxide. Thus, when their balance is optimized, the stock removal rate of the copper layer will be maximum. Accordingly, the stock removal rate tends to be small if the content of hydrogen peroxide is too much or too small.

Further, the anticorrosive which may be used for the polishing composition of the present invention, is believed to more firmly adsorb on the copper film surface than α-alanine and thus provides a function to protect the copper film surface. Therefore, the etching effect against the copper layer will be suppressed, whereby it is possible to obtain a surface excellent in smoothness.

When the polishing composition of the present invention is used for polishing a solid printed layer (a wafer having only a layer of copper or a tantaium-containing compound formed), the stock removal rate of the copper layer is usually at least 4,000 Å/min and can be made to be at least 5,000 Å/min, for example, by optimizing the polishing compositions. Whereas, the stock removal rate of the tantalum-containing compound layer is usually at most 200 Å/min and can be made to be at most 100 Å/min by optimizing the polishing conditions. Thus, it is possible to polish the copper layer at a high stock removal rate, while polishing the tantalum compound layer at a low stock removal rate. If this is. represented by a selectivity ratio, the selectivity ratio will be usually at least 20, and can be made to be at least 50 by optimizing the polishing conditions. By such a high selectivity ratio, detection of the end point of the polishing will be easy, and high yield can be accomplished. Further, by the polishing composition of the present invention, polishing can be carried out with high efficiency while maintaining excellent surface smoothness, whereby a high throughput can be realized.

Now, the present invention will be described in further detail with reference to Examples. However, it should be understood that the present invention is by no means restricted to such specific Examples.

EXAMPLES 1 to 27 AND COMPARATIVE EXAMPLES 1 and 2

Preparation of Polishing Compositions

Colloidal silica as an abrasive, hydrogen peroxide and α-alanine or glycine, were added and mixed in the proportions as identified in Table 1 to obtain polishing compositions of Examples 1 to 27 and Comparative Examples 1 and 2. As the hydrogen peroxide, a commercially available 31% aqueous solution was employed, and it was mixed immediately before polishing.

Polishing Tests

As objects to be polished, a 6-inch silicon wafer having a copper layer formed in a thickness of 49 about 10,000 Å by sputtering, and a 6-inch silicon wafer having a tantalum layer formed in a thickness of about 2,000 Å by sputtering, were used, and the layer-formed side of each wafer was polished.

Polishing was carried out by means of a one side polishing machine (table diameter: 570 mm). To the table of the polishing machine, a laminated polishing pad made of polyurethane (IC-1000/Suba400, manufactured by Rodel Inc., U.S.A.) was bonded. Firstly, the copper layer-attached wafer was mounted and polished for one minute, and then it was changed to the tantalum layer-attached wafer, which was likewise polished for one minute. The polishing conditions were such that the polishing pressure was 490 g/cm$^2$, the table rotational speed was 40 rpm, the feed rate of the polishing composition was 50 cc/min, and the rotational speed of the wafer was 40 rpm.

After the polishing, the wafers were sequentially washed and dried, whereupon the thickness reduction of the layer of each wafer by polishing was measured at 49 points, whereby the stock removal rates in the respective tests were obtained. Further, the polished surface after polishing was observed by an optical microscope, and the surface condition after the polishing was evaluated in accordance with the following standards.

⊚: Excellent

○: Smoothness slightly impaired

Δ: Smoothness partially impaired

X: Corrosion observed on the surface, and smoothness being poor

X X: Corrosion is too severe and smoothness is too poor for practical use

The obtained results are shown in Table 1 together with the compositions of the polishing compositions.

TABLE 1

| | Abrasive (g/l) | | Hydrogen peroxide (mol/l) | Additive (mol/l) | | Stock removal rate (Å/min) Cu | Ta | Selectivity ratio | Surface condition after polishing |
|---|---|---|---|---|---|---|---|---|---|
| Example 1 | C1* | 5 | 0.1 | A* | 0.1 | 2,000 | 21 | 95.2 | ◎ |
| Example 2 | C1 | 10 | 0.1 | A | 0.1 | 3,068 | 31 | 99.0 | ◎ |
| Example 3 | C1 | 30 | 0.1 | A | 0.1 | 4,903 | 60 | 81.7 | ◎ |
| Example 4 | C1 | 100 | 0.1 | A | 0.1 | 7,347 | 126 | 58.3 | ◎ |
| Example 5 | C1 | 200 | 0.1 | A | 0.1 | 8,185 | 207 | 39.5 | ◎ |
| Example 6 | C1 | 250 | 0.1 | A | 0.1 | 8,385 | 241 | 34.8 | ◎ |
| Example 7 | C1 | 50 | 0.005 | A | 0.1 | 493 | 76 | 6.5 | ◎ |
| Example 8 | C1 | 50 | 0.01 | A | 0.1 | 2,030 | 79 | 25.7 | ◎ |
| Example 9 | C1 | 50 | 0.03 | A | 0.1 | 4,056 | 81 | 50.1 | ◎ |
| Example 10 | C1 | 50 | 0.05 | A | 0.1 | 5,017 | 82 | 61.2 | ◎ |
| Example 11 | C1 | 50 | 0.1 | A | 0.1 | 5,814 | 83 | 70.0 | ◎ |
| Example 12 | C1 | 50 | 0.15 | A | 0.1 | 5,757 | 83 | 69.4 | ◎ |
| Example 13 | C1 | 50 | 0.3 | A | 0.1 | 4,990 | 77 | 64.8 | ◎ |
| Example 14 | C1 | 50 | 1.0 | A | 0.1 | 3,659 | 82 | 44.6 | ○ |
| Example 15 | C1 | 50 | 1.5 | A | 0.1 | 3,233 | 78 | 41.4 | △ |
| Example 16 | C1 | 50 | 0.1 | A | 0.01 | 984 | 61 | 16.1 | ◎ |
| Example 17 | C1 | 50 | 0.1 | A | 0.02 | 1,986 | 68 | 29.2 | ◎ |
| Example 18 | C1 | 50 | 0.1 | A | 0.05 | 4,530 | 71 | 63.8 | ◎ |
| Example 19 | C1 | 50 | 0.1 | A | 0.15 | 6,915 | 80 | 86.4 | ◎ |
| Example 20 | C1 | 80 | 0.1 | A | 0.2 | 7,104 | 83 | 85.6 | ○ |
| Example 21 | C1 | 80 | 0.1 | A | 0.25 | 7,408 | 79 | 93.8 | △ |
| Example 22 | C2* | 80 | 0.1 | A | 0.1 | 3,918 | 62 | 63.2 | ◎ |
| Example 23 | C3* | 5 | 0.1 | A | 0.1 | 4,800 | 73 | 65.7 | ◎ |
| Example 24 | C4* | 5 | 0.1 | A | 0.1 | 5,371 | 77 | 69.6 | ◎ |
| Example 25 | C5* | 5 | 0.1 | A | 0.1 | 6,066 | 89 | 68.2 | ◎ |
| Example 26 | C6* | 5 | 0.1 | A | 0.1 | 6,444 | 21 | 70.0 | ◎ |
| Example 27 | C7* | 5 | 0.1 | A | 0.1 | 5,814 | 94 | 61.9 | ○ |
| Comparative Example 1 | C1 | 50 | 0.1 | G* | 0.1 | 3,500 | 200 | 17.5 | X |
| Comparative Example 2 | C1 | 50 | 0.3 | G | 0.1 | 8,000 | 200 | 40.0 | XX |

Abrasives

C1: Colloidal silica (primary particle size: 0.03 μm)

C2: Colloidal silica (primary particle size: 0.005 μm)

C3: Colloidal silica (primary particle size: 0.01 μm)

C4: Colloidal silica (primary particle size: 0.015 μm)

C5: Colloidal silica (primary particle size: 0.1 μm)

C6: Colloidal silica (primary particle size: 0.2 μm)

C7: Colloidal silica (primary particle size: 0.3 μm)

Additives

A: α-Alanine

G: Glycine

From the results shown in Table 1, it is evident that with the polishing compositions of the present invention, the stock removal rate of the copper (Cu) layer is high, while the stock removal rate of the tantalum (Ta) film is low, and the selectivity ratio is high, and at the same time, the polished surface is excellent in smoothness.

According to the present invention, in a CMP process of a semiconductor device comprising at least a copper layer and a tantalum-containing compound layer, the stock removal rate of the copper layer can be made high, while the stock removal rate of the tantalum-containing compound can be made small, to provide a high selectivity ratio, and it is possible to obtain a polished surface excellent in smoothness. Further, according to the present invention, in the above-mentioned production of a semiconductor device, it is possible to provide a semiconductor device in good yield.

What is claimed is:

1. A polishing composition comprising the following components:

(a) an abrasive,
(b) α-alanine,
(c) hydrogen peroxide, and
(d) water.

2. The polishing composition according to claim 1, wherein the abrasive is at least one member selected from the group consisting of silicon dioxide, aluminum oxide, cerium oxide, zirconium oxide, titanium oxide, silicon nitride and silicon carbide.

3. The polishing composition according to claim 1, wherein the abrasive is at least one member selected from the group consisting of fumed silica, colloidal silica, fumed alumina and colloidal alumina.

4. The polishing compositio[008e] according to claim 1, wherein the abrasive has a primary particle size of from 0.01 to 0.3 μm, and the content of the abrasive is from 10 to 200 g/l, based on the polishing composition.

5. The polishing composition according to claim 1, wherein the content of α-alanine is from 0.02 to 0.2 mol/l, based on the polishing composition.

6. The polishing composition according to claim 1, wherein the content of hydrogen peroxide is from 0.01 to 1 mol/l, based on the polishing composition.

7. The polishing composition claimed in claim 1, wherein the α-alanine is present at from 0.05 to 0.15 mol/l.

8. The polishing composition claimed in claim 1, further comprising β-alanine.

9. The polishing composition claimed in claim 1, further comprising an anti-corrosive, a pH adjusting agent, a surfactant, or mixtures thereof.

10. The polishing composition claimed in claim 9, wherein the anti-corrosive is selected from the group consisting of benzotriazole, tolyltriazole, benzimidazole, triazole and imidazole.

11. The polishing composition claimed in claim 10, wherein the anti-corrosive is present at a concentration of from 0.005 to 0.0012 mol/l.

12. The polishing composition claimed in claim 9, wherein the pH-adjusting agent is selected from the group consisting of hydrochloric acid, nitric acid, sulfuric acid, chloroacetic acid, tartaric acid, succinic acid, citric acid, malic acid, malonic acid, potassium hydroxide, sodium hydroxide, ammonia, ethylene diamine, piperazine, polyethyleneimine, fatty acids and polycarboxylic acids.

13. The polishing composition claimed in claim 9, wherein the surfactant is selected from the group of consisting of a dispersing agent, a wetting agent, a thickener, a defoaming agent, a foaming agent and a water repellant.

* * * * *